United States Patent [19]

Dumoulin

[11] Patent Number: 5,022,398

[45] Date of Patent: Jun. 11, 1991

[54] MULTIPLE-ECHO NMR ANGIOGRAPHY FOR ENHANCEMENT OF SIGNAL-TO NOISE RATIO

[75] Inventor: Charles L. Dumoulin, Ballston Lake, N.Y.

[73] Assignee: General Electric Company, Schenectady, N.Y.

[21] Appl. No.: 497,288

[22] Filed: Mar. 22, 1990

Related U.S. Application Data

[62] Division of Ser. No. 235,144, Aug. 23, 1988, abandoned, which is a division of Ser. No. 13,592, Feb. 11, 1987, Pat. No. 4,796,635.

[51] Int. Cl.[5] .............................................. A61B 5/035
[52] U.S. Cl. ............................... 128/653 AF; 324/306; 324/309
[58] Field of Search ................. 128/653 AF; 324/306, 324/309

[56] References Cited

U.S. PATENT DOCUMENTS

| | | | |
|---|---|---|---|
| 4,443,760 | 4/1984 | Edelstein et al. | 324/309 |
| 4,458,203 | 7/1984 | Young | 324/309 |
| 4,568,880 | 2/1986 | Sugiomoto | 324/309 |
| 4,595,879 | 6/1986 | Lent et al. | 324/309 |
| 4,602,641 | 7/1986 | Feinberg | 128/653 |
| 4,654,591 | 3/1987 | Moran | 324/306 |
| 4,714,081 | 12/1987 | Dumoulin et al. | 128/653 |
| 4,777,957 | 10/1988 | Wehrli et al. | 128/653 AF |
| 4,796,635 | 1/1989 | Dumoulin | 128/653 |
| 4,832,037 | 5/1989 | Granot | 128/653 A |

Primary Examiner—Ruth S. Smith
Attorney, Agent, or Firm—Marvin Snyder; James C. Davis, Jr.

[57] ABSTRACT

Several sequences of radio-frequency and magnetic field gradients are presented for obtaining from a sample multiple response echo signals from which to obtain a plurality of independent angiograms, which can be combined or separately analyzed to provide more information than an individual angiogram, but in substantially the same amount of time as a single angiogram. For example, a series of angiograms, each with a different projection axis, can be obtained in the time required to obtain a single angiogram using a single echo method. If the view angle of each echo is the same, then the acquired angiograms can be added to enhance the signal-to-noise ratio. Another pulse sequence simultaneously obtains two or more angiograms, each sensitive to one of two orthogonal flow components of the overall blood flow; the angiograms are then added to give an angiogram which is sensitive to total flow in all directions. Multiple velocity ranges are accommodated in a fourth sequence form.

3 Claims, 6 Drawing Sheets

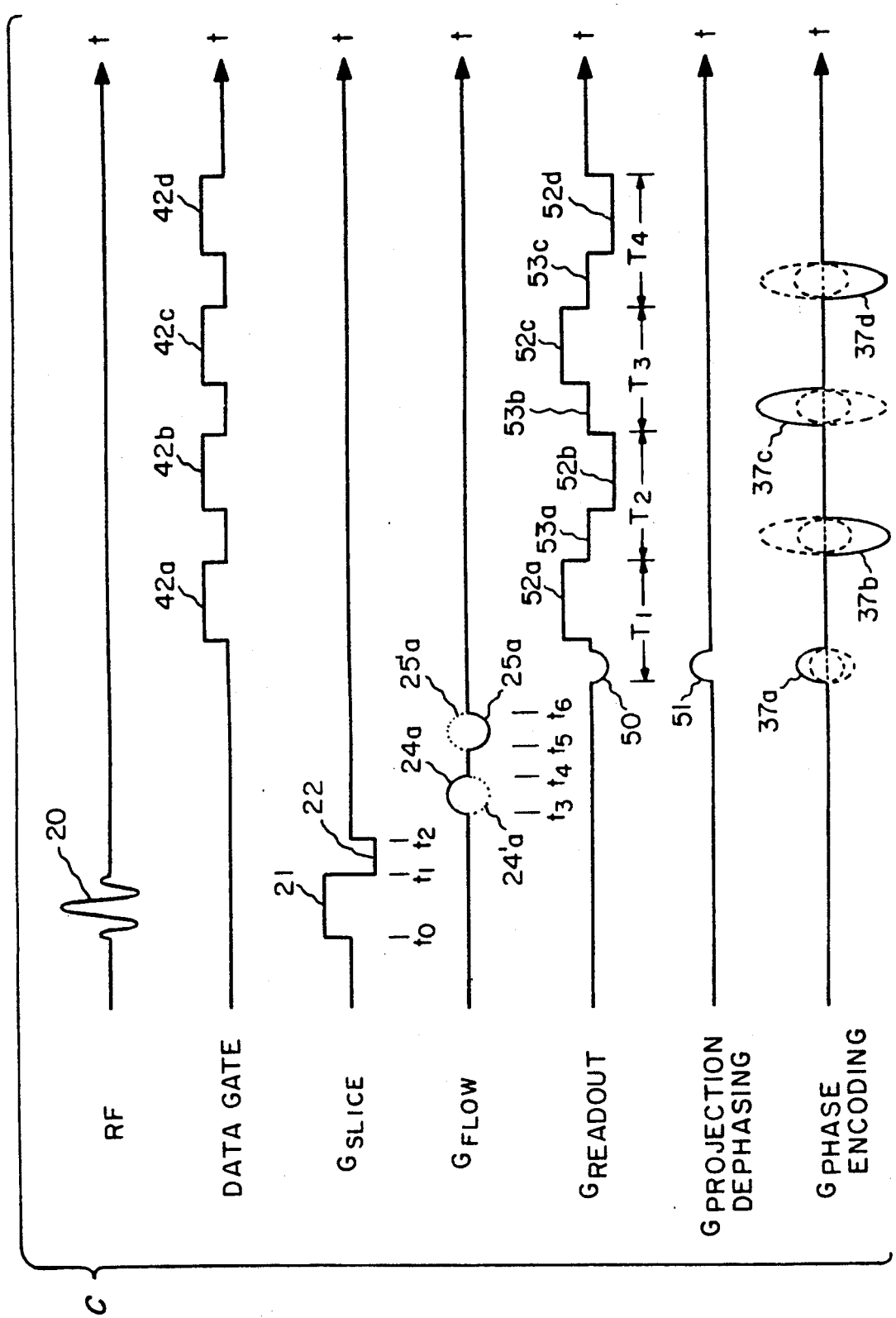

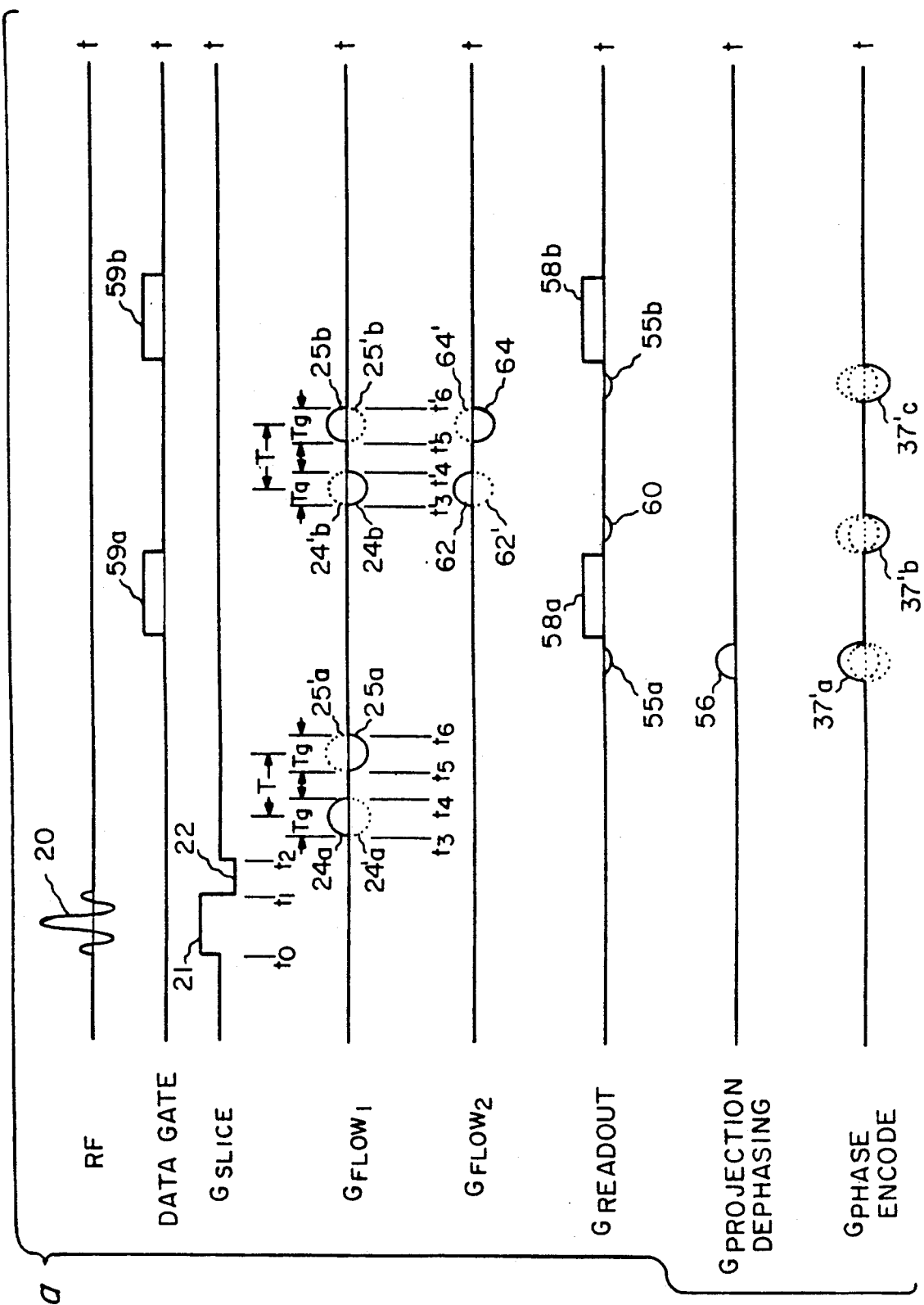

5,022,398

MULTIPLE-ECHO NMR ANGIOGRAPHY FOR ENHANCEMENT OF SIGNAL-TO NOISE RATIO

This application is a division of application Ser. No. 235,144, filed Aug. 23, 1988, now abandoned which is a division of application Ser. No. 013,592, filed Feb. 11, 1987 U.S. Pat. No. 4,796,635.

BACKGROUND OF THE INVENTION

The present invention relates to nuclear magnetic resonance (NMR) angiographic methods for imaging fluid flow in a sample, and, more particularly, to novel NMR angiographic methods in which multiple responses are generated for each excitation of the sample, as for providing medically-significant anatomy images of fluid flow in non-invasive manner.

It is known to provide NMR angiographic data images, indicating the flow of bodily fluids through various bodily passages, for medical diagnostic purposes. Methods for producing such images are described and claimed in U.S. Pat. No. 4,714,081, issued Dec. 22, 1987, assigned to the assignee of the present application and incorporated here in its entirety by reference. While those methods provide true projection images and allow high quality angiograms of arterial and venational structures to be obtained along a selected projection axis and with a selected direction of flow sensitivity in a sample, it is still highly desirable to obtain even further information in the NMR angiograms. For example, projection images along multiple axes of projection are desirable, as an entire flow angiogram can be provided if a plurality of angiograms, each sensitive to orthogonal flow components, can be combined. Further, it may be desirable to improve the signal-to-noise ratio of an angiogram (even along a single axis of projection) to: enhance suppression of motion artifacts; obtain a series of angiograms each sensitive to a different range of flow velocities; and the like. However, with a cardiac-gated NMR angiogram using only one pulse sequence per cardiac cycle, and needing 128 phase-encoding steps in a spin-warp imaging sequence with only one flow direction, the minimum imaging time presently requires about 4 minutes, dependent on heart rate. For two flow directions, requiring twice as many excitation sequences, about 16 minutes may be required for acquisition of data from the patient (sample). It is extremely difficult to maintain the patient in a non-moving state for even these time intervals, much less the additional time intervals required for additional views, etc. Accordingly, methods for providing NMR angiograms with improved features, without requiring substantial additional data acquisition time and without sensitivity to misregistration due to sample movement, are highly desirable.

BRIEF SUMMARY OF THE INVENTION

In accordance with the invention, methods for providing a nuclear magnetic resonance angiographic image substantially only of moving spins associated with fluid flow in a sample, includes the steps of: immersing the sample in a main static magnetic field; nutating, in the initial part of each of a first sequence and a second sequence of a sequential pair of imaging sequences for each of a multiplicity S of regions of said selected sample portion, the spins of all nuclei of a selected species; applying a pair of alternating-polarity flow-encoding signal pulses in a first magnetic field gradient impressed upon the sample, in a first direction selected to cause a resulting NMR response echo signal from the spin of a moving nucleus to differ from the NMR response echo signal from the spin of a substantially stationary nucleus; each of the flow-encoding pulses in the first sequence of each pair having a polarity opposite to the polarity of the like-positioned flow-encoding pulse in the second sequence of each pair; acquiring, responsive to a readout magnetic field gradient impressed upon the sample in a second direction, substantially orthogonal of the first direction, a set of data from the NMR response echo signal evoked, from at least the sample portion, in each different one of a plurality N of response data acquisition time intervals of each of the first and second sequences; subtracting the data in each j-th one, where $1 \leq j \leq N$, of the NMR response signal data sets acquired in a selected one of the first and second sequences, from the data in the like-numbered j-th data set of the remaining one of the first and second sequences, to generate a j-th one of a plurality N of difference data sets from which response data obtained from stationary nuclei has been substantially removed; and generating, responsive to all j-th difference data sets, each of at least one angiographic projection image, each lying in a plane having a preselected relationship with respect to the first and second directions.

In presently preferred embodiments of my novel multi-echo NMR angiographic methods, the flow-encoding step is performed in a manner such that the sequences will, in substantially the same time as required for a single NMR angiographic image to be obtained, produce a set of images, each at a different angle with respect to a common origin, and, if required, with an increased signal-to-noise ratio in at least one image of the set; a single image with increased signal-to-noise ratio; a total-flow angiographic image; at least one image with increased suppression of motional artifacts; or a plurality of images each of flow at a different velocity.

Accordingly, it is an object of the present invention to provide novel methods for multi-echo nuclear magnetic resonance angiographic imaging of moving fluid flowing in vessels through a desired portion of a sample, such as the anatomy of a living subject.

This and other objects of the present invention will become apparent upon reading the following detailed description of my invention, when considered in conjunction with the drawings.

BRIEF DESCRIPTION OF THE DRAWINGS

FIG. 2c is a third set of time-coordinated graphs illustrating the RF, data gate and magnetic field gradient signals utilized in one complete repetition of one presently preferred method for improving the signal-to-noise ratio along a single projective axis, in a general NMR system;

FIG. 3a is a set of time-coordinated graphs illustrating RF, data gate and magnetic field gradient signals for one complete repetition of a presently preferred embodiment of a multiple-echo NMR angiographic sequence for simultaneously acquiring information along a pair of orthogonal flow directions.

DETAILED DESCRIPTION OF THE INVENTION

Figure 1:
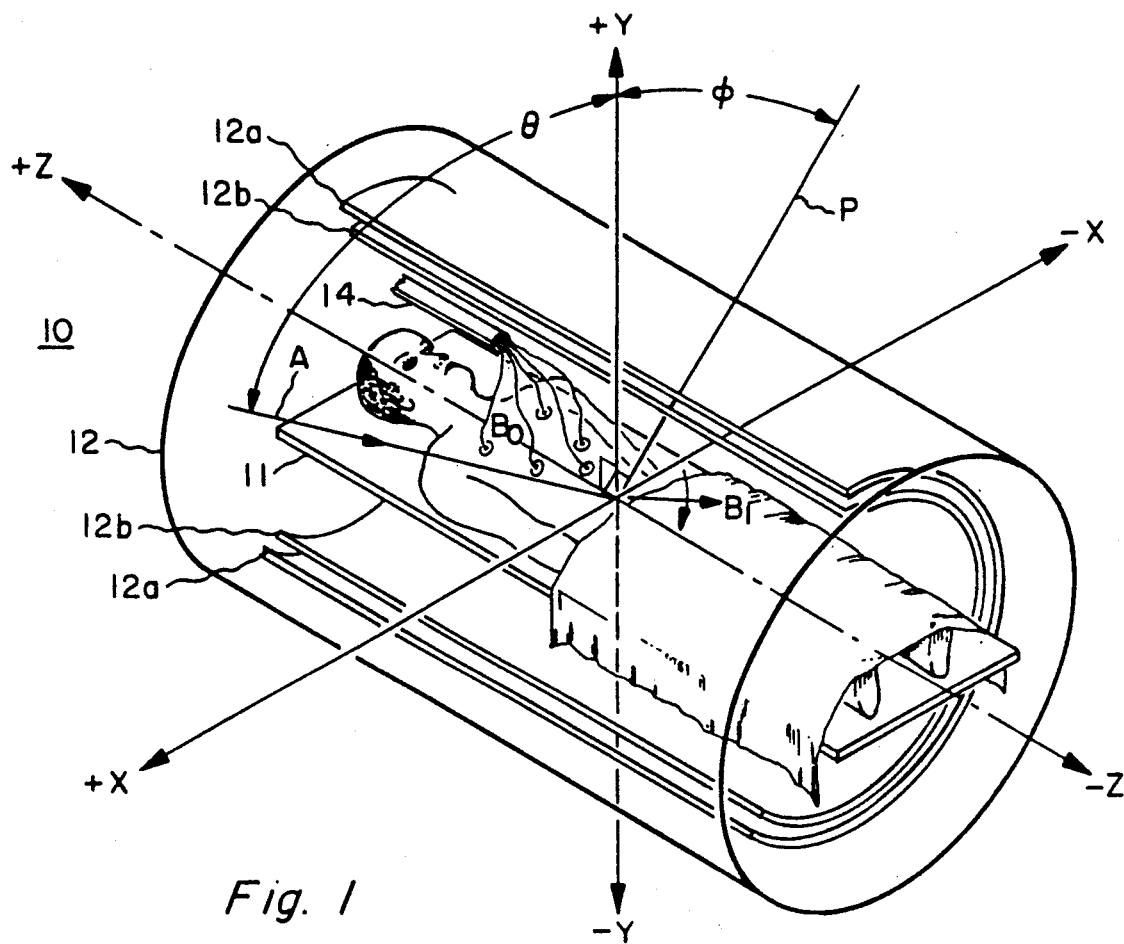
FIG. 1 is a perspective view of the bore of a magnet for producing a static field in a NMR imaging apparatus, illustrating sample positioning amidst the various magnetic field gradient and RF field-producing means, and useful for defining various conventions utilized therewith.

Referring initially to FIG. 1, the method of the present invention is practiced in a nuclear magnetic resonance (NMR) system 10 in which a sample, e.g., a patient, is placed upon carrier means 11 and moved into an imaging region. This region, illustrated as being within the bore 12 of a magnet means (not shown), is one in which a highly homogeneous and relatively high-intensity static magnetic field $B_O$ is provided. The illustrated static magnetic field-forming means bore 12 is cylindrical and the static magnetic field $B_O$ is formed along a chosen volume axis, e.g., the Z axis of a Cartesian coordinate system having its center within the magnet means bore. Magnetic field gradient-forming means 12a, associated with the main static magnetic field -forming means bore 12, is used to form a set of substantially orthogonal magnetic field gradients impressed upon the static field. For the illustrated Cartesian coordinate system, the gradients $G_X$, $G_Y$ and $G_Z$ can be summarized as: $G_Z = \partial B_O/\partial z$, $G_Y = \partial B_O/\partial y$, $G_X = \partial B_O/\partial x$. In addition to the static magnetic field $B_O$ and the magnetic field gradients $G_X$, $G_Y$ and $G_Z$ therein provided by the gradient coil means 12a (typically positioned within the magnet means bore 12), at least one coil means 12b (also typically positioned within bore 12 and further situated within the bore of gradient coils 12a) is energized (by means not shown) to provide a radio-frequency (RF) magnetic field $B_1$ rotating at the resonance, or Larmor frequency $w = \alpha B_O$, where $\alpha$ is the gyromagnetic constant for the particular nuclear species to be imaged. The static magnetic field $B_O$, the magnetic field gradients $G_X$, $G_Y$ and $G_Z$ and the RF magnetic field $B_1$ are all provided by means, and in manner, well known to the art. In addition to the remainder of the NMR imaging system (not shown) monitor lead means 14, for providing caridac (EKG) signals to the NMR imaging system, may be provided to the chest area of the patient to be imaged. As explained in the forementioned application, cardiac gating of the NMR angiography sequences could be used to prevent periodic motion artifacts, i.e., ghosts, from appearing in the final image and or for selecting a particular portion of interest of the cardiac cycle during which the angiograph is taken.

Figure 2:
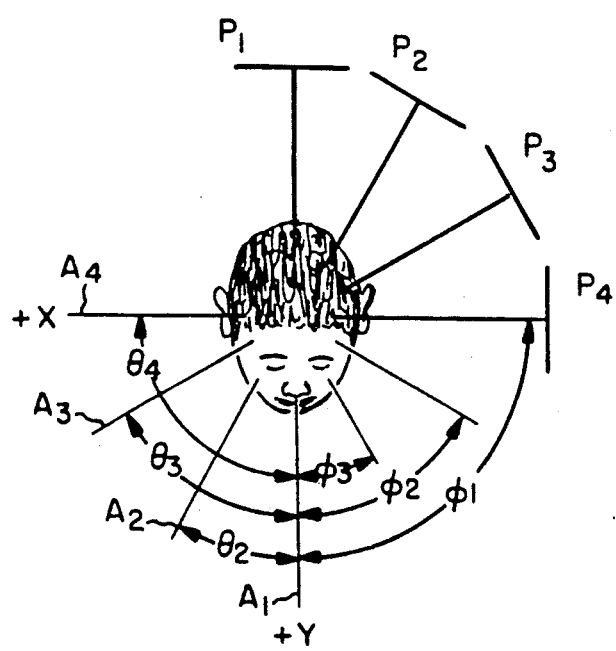
FIG. 2 is a schematic view of a portion of human anatomy and of a plurality of projective directional axes and associated projection planes established with respect thereto.

Referring now to FIG. 2, the NMR angiographic methods of the aforementioned application allowed a single angiographic projection to be acquired in each acquisition time interval. Thus, each sequential pair of applications of magnetic field gradient and RF magnetic field pulse signals provides one difference set of NMR response signals containing information as to the concentration of motion of the spins of a selected nuclear species, when viewed along one, and only one, imaging axis of projection A, and for one of a multiplicity S (typically 128 or 256) of parallel stripes of an image to be projected in a projection plane P. Thus, a plurality N of angiographic projections, each along a different projection axis $A_n$ and onto a different projection plane $P_n$, required application of (NxS) sequential pairs of pulse sequences, each positioned in a different sequential, non-overlapping acquisition time interval. For example, to acquire the information for N=4 angiographic projections, along respective axis $A_1$, $A_2$, $A_3$ and $A_4$, at respective angles $\theta$ (with respect to the +Y axis) of $\theta_1 = 0°$, $\theta_2 = 30°$, $\theta_3 = 60°$ and $\theta_4 = 90°$, four consecutive acquisition intervals would be required. Since each interval is typically in the 2-20 minute range, the procedure would require from 8 to 80 minutes, and the patient would have to be relatively constrained in a single position to reduce motional artifacts.

In accordance with one aspect of the invention, the acquisition of a plurality of informational echo responses for each excitation sequence is provided, with the additional echoes being generated and detected using either RF $\pi(180°)$ refocussing pulses or gradient magnetic field refocussing pulses. Each additional echo is utilized to provide additional information which either complements or supplements the information obtained in the first echo response in each sequence. If each of an even number of sequences (required due to the alternating-polarity of flow encoding gradient field pulses in sequence pairs) is initiated at the same point in the cardiac cycle, any number N of multiple-echo response signals can be formed and acquired, as long as the total sequence time duration is less than the sequence repetition time interval $T_R$, which itself is set by the patient's cardiac cycle, i.e. is set to the reciprocal of the patient's pulse rate.

Prior to describing the various preferred embodiments of my novel multi-echo NMR angiographic methods, a brief statement is presented of the applicable theory for imaging macroscopic spin motion by a monitoring of spin magnetization phase. The required information about transverse spin magnetization phase change is readily derived from a bimodal flow-encoding gradient pulse set, i.e. a pair of pulses having opposite polarity in each excitation sequence, and with polarity alternating in alternating ones of the sequences. The Larmor frequency ($\omega$), in the presence of a magnetic field gradient, is dependent upon the position of the spin provided the response signal; thus, $\omega(z) = \alpha(3_0 + z \cdot G_z)$, where $G_z$ is the magnetic field gradient strength in the desired direction, e.g. the Z direction. Responsive to an applied gradient pulse which starts at a time $t=0$ and ends at another time $t=T_g$, the transverse spin magnetization phase change $\phi$ is $$\phi = \int_0^{T_g} z(t)G_z(t)dt \qquad (1)$$

where $z(t)$ and $G_z(t)$ are the spin position and gradient field strength as respective time functions. Both moving and non-moving excited spins will be subjected to the gradient field; only the moving excited spins have a non-constant spin position time function $z(t)$. If the excited spins experience constant motion of the direction of the applied field gradient, this spin position time function $z(t) = Z_O - Vt$, where $Z_O$ is the spin position at time $t = 0$ and V is the spin velocity. Inserting this spin position time function into equation 1 indicates that the moving spin has a phase change $$\phi = \gamma \int_0^{T_g} Z_0 G_z(t)dt - \gamma \int_0^{T_g} V t G_z(t) dt. \qquad (2)$$

If a second gradient pulse $G'_z(t)$ is applied to the sample at a time T after the beginning of the first gradient pulse, the entire phase shift $\phi$ introduced by the gradient magnetic field pulse pair is given as:

$$\phi = \gamma \int_0^{T_g} Z_0 G_z(t)dt - \gamma \int_0^{T_g} V t G_z(t)dt + \qquad (3)$$
$$\gamma \int_T^{(T+T_g)} Z_1 G_z'(t)dt - \gamma \int_T^{(T+T_g)} V t G_z'(t)dt.$$

where $Z_1$ is the position of the spin at the commencement of the second gradient pulse $G'_z(t)$. If the second gradient pulse is made identical in shape and amplitude to the shape and amplitude of the first gradient pulse, but is given opposite polarity, i.e. $G'_z(t) = -G_z(t)$ and $T'_g = T_g$, equation 3 reduces to $$\phi = \gamma A_g(Z_O - Z_l) \qquad (4)$$

where $A_g$ is the total area under each gradient pulse. Since the velocity of the spins is assumed to be constant, $Z_O - Z_l = VT$, and therefore, $\phi = \alpha A_g VT$, which provides the basis for selective detection of moving spin magnetization; it will be seen that the phase shift induced in the spin magnetization of stationary spins, having (by definition) a velocity $V=0$, by a bimodal pair of gradient pulses, is itself zero. Conversely, it will be seen that the phase shift induced by moving spin magnetization depends linearly on the spin velocity V, the interpulse delay time interval T and the gradient pulse area ($A_g$). Therefore, data acquired for two different conditions of any of these three variables (V, T or $A_g$) can be subtracted, one from the other, to leave a resultant containing only spin density information for moving spins. As discussed in the aforementioned application, while NMR angiography will work with one sequence of a pair being devoid of the bimodal gradient pulses, a better result is obtained if the polarity of the flow-encoding gradient pulses are inverted on alternate excitations; this form is used in the illustrative pulse sequences described herein.

From the foregoing brief theoretical exposition, it will be seen that the complex difference of two data sets, each acquired from a different one of two echoes (as described above) has a modulus which is a sinusoidal function of spin velocity. This presents the possibility of aliasing conditions wherein certain spin velocities will provide no observed signal, or will be indistinguishable from lower spin velocities. The aliasing problem can be obviated if the induced phase shift is constrained to be less than $\pi$ radians. In fact, if the induced phase shift $\phi$ is constrained to be less than one radian, the image intensity is approximately linear with respect to spin velocity. Since the measured signal intensity is also a linear function of the number of spins, image pixel intensity is proportional to volume (and therefore mass) flow, so that the total flow of blood within a vessel can be measured by integrating the signal intensity across the vessel. While only that flow component in the direction of the applied flow-encoding gradient is imaged with such a pulse sequence, the total flow angiogram can be obtained by acquiring two separate angiograms, each sensitive in a flow direction orthogonal to one another and also orthogonal to the projection axis, and combining these two individual angiograms using the relationship $I_t = (I_A^2 + I_B^2)^{\frac{1}{2}}$, where $I_t$ is the total intensity and $I_A$ and $I_B$ are the intensities of the corresponding pixels in the two orthogonal angiograms. Finally, it should be realized that an angiogram can be generated by providing the flow-encoding gradient pulses with any standard imaging procedure. The imaging procedure utilized here is the gradient-refocussed spin-warp sequence, although spin-echo refocussed spin-warp and the like procedures can be utilized.

MULTIPLE VIEW ANGLES

The projection axis A of a projection angiogram is defined by the angle $\theta$, formed between axis A and a selected first one (e.g., +Y) of the imaging system primary coordinate system axes, and an angle $\phi$ formal between axis A and another system axis (e.g., +X) which is orthogonal to the first axis. The angles $\theta$ and $\phi$ are determined by the orientation of the readout gradient magnetic field and the phase-encoding gradient magnetic field orientation; the readout and phase-encoding gradient fields are orthogonal. In many imaging applications, the orthogonal readout and phase-encoding gradients are (1) pulsed and (2) applied along different ones of the Cartesian coordinate axes. Views oblique to the coordinate system axes can be obtained by applying readout gradient pulses and/or phase-encoding gradient pulses which each have components along two or three coordinate system axes, and have amplitudes which are easily derived from trigonometric relationships, e.g. for an angiogram projected upon some plane $P_k$, orthogonal to a projection axis $A_k$ established at an angle $\theta_k$ with respect to the +Y axis (and with $\theta_k = 90°$ with respect to the Z axis), the X-axis readout gradient component $G_X = \cos(\theta_k) G_{x,max}$ and the Y-axis readout component $G_Y = \sin(\theta_k) G_{x,max}$ and the Y-axis readout component $G_Y = \sin(\theta_k) G_{Y,max}$. This allows an angiographic image to be obtained with constant resolution as the projection angle $\theta$ is varied, without the need for moving the subject being imaged.

Figure 2A:
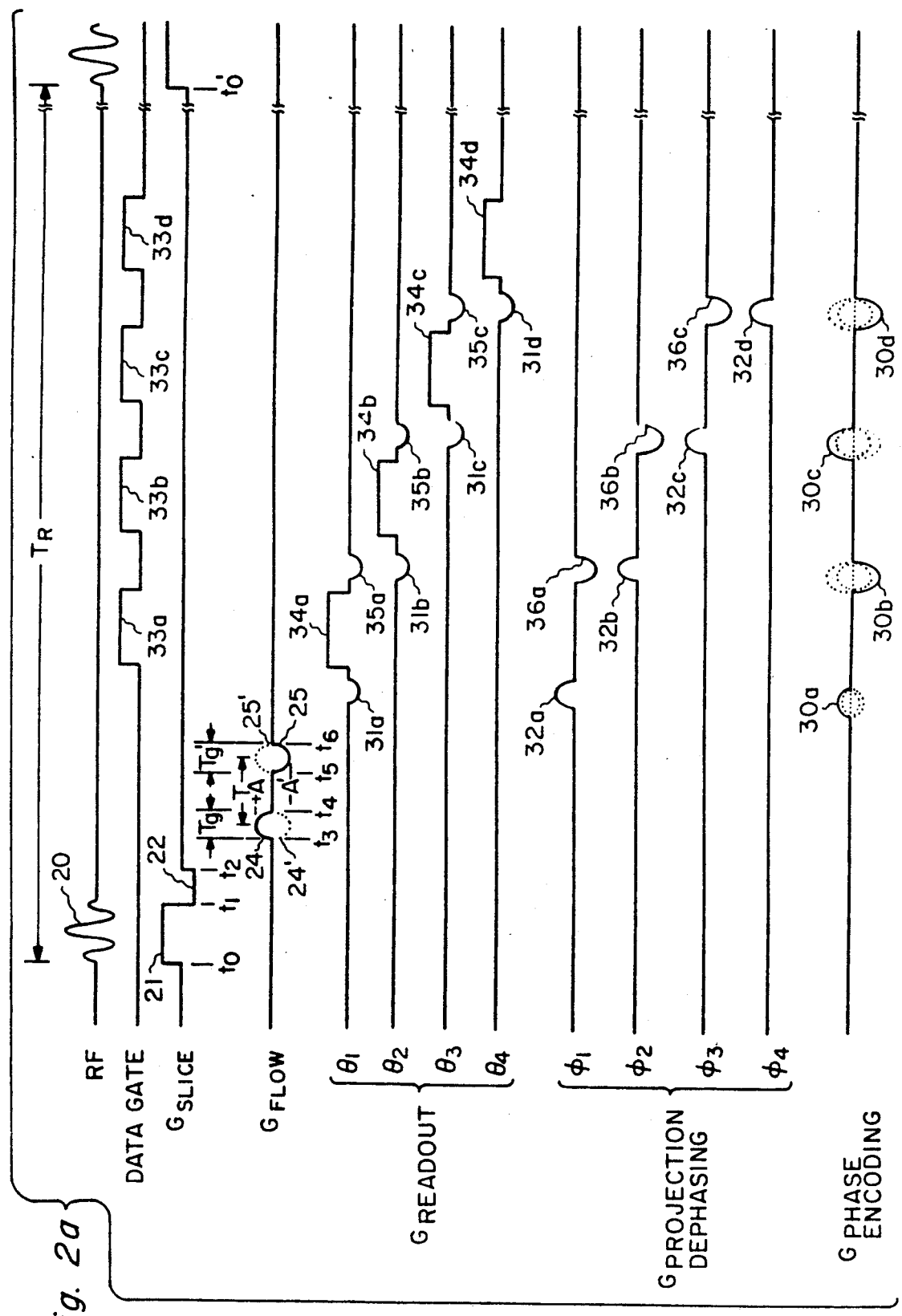
FIG. 2a is a set of time-coordinated graphs illustrating the radio-frequency, data gate and magnetic field gradient signals utilized during one complete repetition of one presently preferred method for obtaining a plurality of different interleaved NMR angiographic images, each along a different axis of projection, with multiple-echo NMR angiography in a general NMR system.

In accordance with one aspect of this invention, the data for each of a plurality N of angiograms, each with a different view angle $\theta_k$, where $1 \leq k \leq N$, is received in interleaved manner in an associated one of the same plurality N of readout intervals $T_k$ during each imaging sequence of each angiographic sequence pair. The general form of RF/gradient pulse sequence for obtaining multiple-view multiple-readout data sets is shown in FIG. 2a. The general sequence requires that the pair of flow-encoding gradient pulses be applied immediately after the single RF pulse of the sequence, with each of the plurality of subsequent multiple echoes being obtained with a different readout gradient orientation. Specifically, the method for obtaining multiple view angles uses pairs of excitation-response sequences, with the sequence of FIG. 2a being used and then repeated with the flow-encoding gradient polarities alternating in the second sequence, as shown by broken line portions in this first sequence, and explained hereinbelow. If required, each readout gradient field pulse may be preceded by a dephasing pulse portion, so that the associated echo is caused to occur in the middle of the associated readout pulse; a rephasing pulse portion may then be applied after each readout gradient field pulse, to remove the phase shift accumulated during the generation of the associated echo. Thus, a phase-invariant RF signal pulse 20 is initially applied to the sample to nutate the spins through 90°. The $\pi/2$ RF pulse 20 is generally not made volume selective; however, pulse 20 can be made slice-selective, to limit the excited sample volume, by the presence of a slice-selective gradient $G_{SLICE}$ portion 21, occurring over at least the same time interval (from time $t_0$ to time $t_1$) as pulse 20. As is well known in the art, if a slice-selection pulse is used, RF pulse 20 can be, for example, of the $\sin(x)/x$ form, and can be truncated to include a specific odd number of lobes, e.g. 5, to substantially sharpen the excited volume limits. As is also well known, if a slice-selective gradient portion 21 is utilized, an associated rephasing portion 22, in the time interval from time $t_1$ to time $t_2$, may be advantageously used. Thereafter, commencing at time $t_3$, the flow-encoding gradient $G_{FLOW}$ is provided with a first pulse 24, having a time duration $T_g$ (from time $t_3$ to time $t_4$), a first polarity and a first amplitude A, and then with a second pulse 25, having a second time duration $T'_g$ (from time $t_5$ to time $t_6$), a second polarity (opposite to the first polarity) and a second amplitude A'; the midpoints of pulses 24 and 25 are separated by the interpulse time interval T. Specifically, the selected sequence pair utilizes a first sequence with a positive polarity first pulse 24 and a negative polarity second pulse 25 (the pulses, shown in broken line, of the second sequence, of the sequence pair, have a negative polarity first pulse 24' and a positive polarity second pulse 25' such that the second sequence pulses are inverted with respect to the polarities of the first sequence pulses); advantageously, both pulses 24 and 25 (and pulses 24' and 25') have the same amplitude $|A|$ and substantially equal time duration $T_g = T'_g$. The multiple echo readouts, each providing a different projection axis set of data, are taken after time $t_6$. For each readout view with one projection angle $\theta_k$, and its associated projection complement angle $\phi_k$ (where $(\theta_k - \phi_k) = 90°$), the phase-encoding gradient $G_{PHASE-ENCODING}$ pulse 30 is applied substantially simultaneously with the dephasing readout gradient $G_{READOUT}$ portion 31; the effect of each pulse 31 on spin phase is subsequently substantially cancelled by the effect of an associated readout gradient portion 34, of inverted-polarity with respect to dephasing gradient portion 31, and further rephasing readout gradient portion 35, of similar polarity to dephasing readout gradient portion 31. A projection-dephasing gradient pulse 32 is utilized to limit the dynamic range of the detected signal; the effect of each pulse 32 on spin phase is subsequently substantially cancelled by the effect of an associated inverted-polarity rephasing projection gradient pulse 36. In addition, each phase-encoding gradient pulse 30b, 30d, . . . of an even-numbered echo is inverted, with respect to the polarity of an odd-echo phase-encoding gradient pulse 30a, 30c, . . . , to cancel velocity-induced phase shifts arising from the pair of phase-encoding gradients. Thus, for the first echo (containing the information for a first projection, along the first axis $A_1$ at a first angle $\theta_1$) the phase encoding gradient portion 30a (having one of the plurality of phase-encoding values, in manner well known to the art) is provided substantially simultaneously with a first readout gradient portion dephasing portion 31a (in the direction of angle $\theta_1$) and a first projection dephasing gradient pulse 32a (in the direction of complement angle $\phi_1$, orthogonal to angle $\theta_1$). After a small time interval, to allow settling of the gradient portions 30a, 31a, and 32a, the data gate is opened (in portion 33a) in the presence of a first readout-encoding gradient portion 34a, for acquisition of first readout interval NMR response data. The data gate then closes. After another short time interval for settling of the readout gradient 34a, a first readout gradient rephasing pulse portion 35a occurs to rephase spin magnetization; the rephasing readout pulse portion 35a occurs substantially simultaneously with a first inverted-polarity projection dephasing pulse portion 36a, applied along the first complementary axis $\phi_1$ to cancel the spin dephasing effect caused by the initial projection dephasing pulse 32a. The inverted phase-encoding gradient portion, which is required at the same time as pulses 35a and 36a, is not individually shown, as this pulse, with a now-negative polarity, is added to the inverted-polarity (e.g. now-negative polarity) phase-encoding gradient portion at the beginning of the even-numbered second readout interval, to form the double-amplitude phase-encoding pulse 30b. That is, the inverted phase-encoding pulse portion at the end of one readout time interval is of the same polarity as the initial pulse portion at the beginning of the next readout time interval (since the phase-encoding gradient polarity is alternated for alternating echoes), so that phase-encoding pulse 30b is of double negative amplitude. At the same time, a second projection angle $\theta_2$ gradient readout dephasing pulse portion 31b occurs, along with a second projection-dephasing pulse portion 32b. It will thus be seen that the termination pulse portions at the end of one readout are made to overlap with the preparatory pulse portions at the commencement of the next echo readout; this temporal overlap allows even greater numbers of different view readouts to sequentially occur at the end of each sequence, in the time remaining before a next cardiac cycle triggers a next sequence. The second NMR echo signal data is (1) encoded by readout gradient portion 34b, (2) received a short time after the termination of pulse portions 30b, 31b and 32b, and (3) then acquired during data-gate-enabled portion 33b. Thereafter, the second view readout is terminated with the substantially simultaneous rephasing gradient pulse portions 35b and 36b, and half of a now-positive-polarity phase-encoding gradient portion 30c. Simultaneously, the third umltiple view echo readout portion commences with the other positive-polarity half of the phase-encoding pulse portion 30c, the readout gradient dephasing portion 31c and projection dephasing pulse 32c. The third view readout, encoded to angle $\theta_3$ by readout gradient portion 34c, is acquired during gate portion 33c, and is then terminated with rephasing pulse portions 35c and 36c and half of phase-encoding pulse 30d. This procedure continues for as many additional echoes as are necessary, each for providing data in the associate different view. Thus, if only four views are required (as here illustrated) and fourth, and final, view echo readout is prepared for by the associated a phase-encoding pulse portion 30d, a readout dephasing pulse portion 31d and a projection-dephasing pulse portion 32d. The fourth view data is acquired during data gate enablement portion 33d, while fourth ($\theta_4$) readout gradient portion 34d is presented. The sequence ends after acquiring the last echo data during the last data gate enabled portion 33d, responsive to the last echo readout gradient portion 34d. Because no data from an additional view is to be taken, no additional readout rephasing pulse portion 35 or inverted-polarity projection dephasing pulse portion 36 is necessary. Similarly, since it is now immaterial as to the effect of the initial pulse-encoding gradient portion 30d for the last echo, an inverted polarity portion of the phase-encoding gradient is not necessary at the termination of the last echo readout. The second sequence of the pair is substantially similar, with only the inversion of the flow-encoding pulses 24' and 25' being different from the characteristics of the first sequence.

The readout gradient orientation angle $\theta_i$, the projection dephasing gradient orientation $\phi_i$ and the phase-encoding direction are all mutually orthogonal. Thus, in principle, the orientation of the phase-encoding gradient for each echo can be changed in the same manner as the orientation of the readout gradient for that echo. If the phase-encoding gradient pulses are applied along one primary system axis, e.g. the Z axis in the Cartesian coordinate system, the dephasing lobe for each echo includes a readout (R) dephasing portion and a projection (P) dephasing portion. For the N-th echo, acquired with a projection angle $\theta_n$, the amplitude $I_x$ and $I_y$ of the pulses, respectively simultaneously applied to the X-axis gradient coil and Y-axis gradient coil are $$I_x = I_R\sin(\theta_N) + I_P\cos(\theta_N) + I_R\sin(\theta_{N-1}) - I_P\cos(\theta_{N-1}) \qquad (5a)$$

$$I_y = I_R\cos(\theta_N) - I_P\sin(\theta + I_R\cos(\theta_{N-1}) + I_P\sin(\theta_{N-1}). \qquad (5b)$$

Figure 2B:
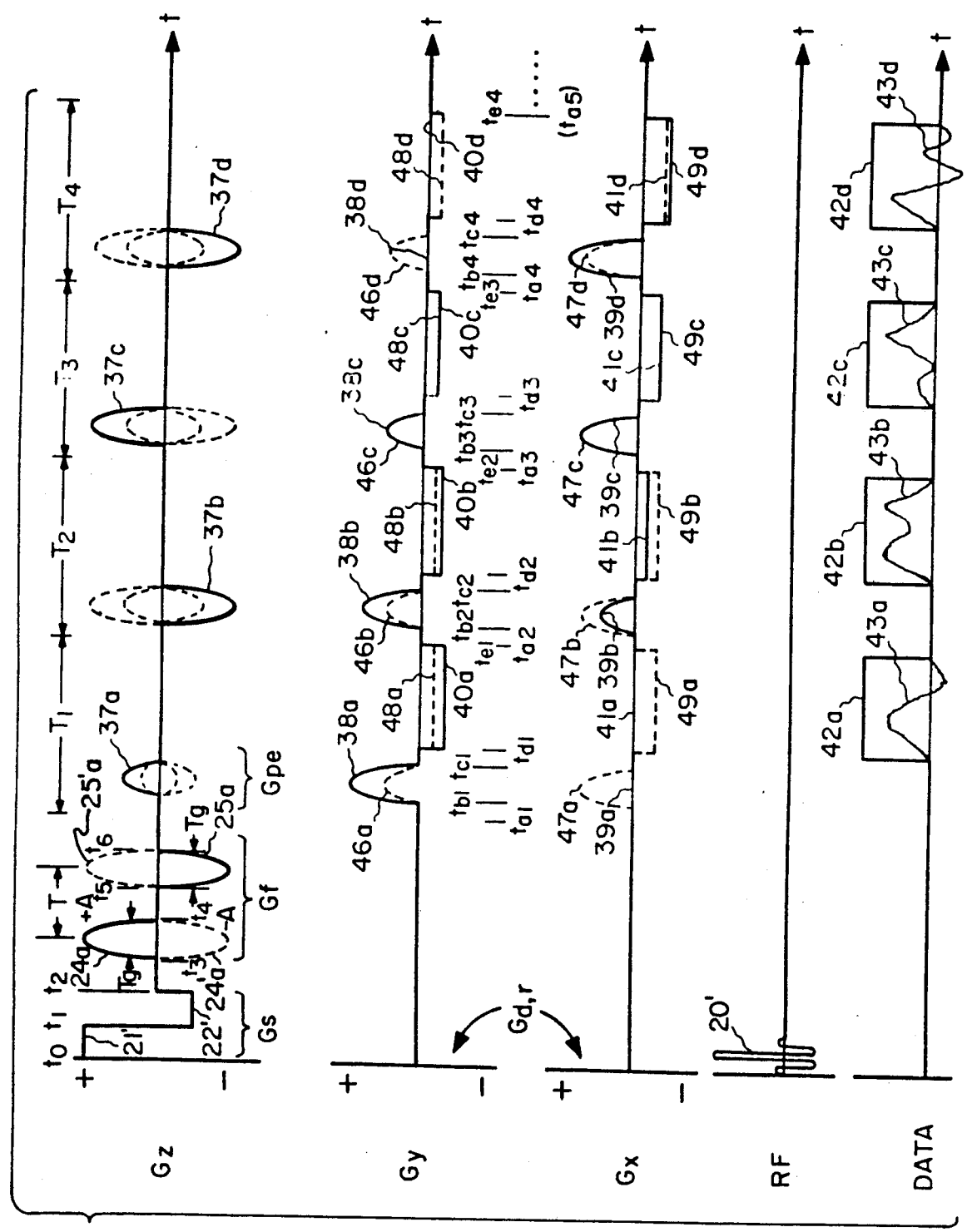
FIG. 2b is a set of time-coordinated graphs illustrating another set of RF, data gate and magnetic field gradient signals utilized during one complete repetition of a presently preferred multiple-view method in a system having Cartesian coordinate magnetic field gradients, for one presently preferred method of increasing the signal-to-noise ratio of a NMR angiographic image obtained along a single projection axis.

When the various gradients of FIG. 2a are properly assigned to gradients along the principle axes of a Cartesian coordinate system, a set of waveforms as shown in FIG. 2b result.

For the illustrative situation of FIG. 2b, four projection angiograms are taken, at angles of $\theta_1 = 0°$, $\theta_2$ of about 30°, $\theta_3$ of about 60° and $\theta_4$ of 90°. Each sequence, of a sequence pair, begins with a slice-selective portion $G_S$ (corresponding to the $G_{SLICE}$ portion in FIG. 2a) comprising (a) the 90° RF pulse 20', and its slice-selective Z-axis gradient $G_Z$ portion 21', in the interval from time $t_0$ to time $t_1$, and (b) slice-selective rephasing gradient portion 22' in the interval from time $t_1$ to time $t_2$. Thereafter, the flow encoding portion $G_f$, corresponding to the $G_{FLOW}$ portion of FIG. 2a, occurs in the Z-axis gradient $G_Z$ with a first, positive-polarity pulse 24a being provided with amplitude +A and time duration $T_g$ (between time $t_3$ and time $t_4$) and a negative-polarity pulse 25a, of amplitude −A being provided in the time interval $T_g$ from time $t_5$ to $t_6$. The temporal midpoints of pulses 24a and 25a are separated by the interpulse time interval T. Thereafter, four multiple-view, multiple echo reception time intervals $T_1$-$T_4$ occur, each commencing at a start time $t_{a1}$-$t_{a4}$ and ending at a termination time $t_{el}$ (identical with the second time interval commencement time $t_{a2}$) $-t_{e4}$ (which would be identical with a fifth echo start time $t_{a5}$ if response data from a next-subsequent echo were to be required). One of phase-encoding gradient pulses 37a-37d is utilized in each echo acquisition time interval $T_1$-$T_4$, at that one of the plurality of values to be utilized for that pair of sequences. A short time after the commencement of the associatd response time interval, the readout dephasing pulse portions 38a and 39a (the latter here being of zero amplitude) occur in the respective $G_Y$ and $G_X$ gradients in the time interval from time $t_{b1}$ to time $t_{c1}$; each lobe 38n and 40n has an amplitude $G_Y = G_{y,max}(\sin\theta_n)$, while each lobe 39n and 41n has an amplitude $G_X = G_{x,max}(\cos\theta_n)$. Thereafter, at time $t_{d1}$ to time $t_{e1}$, the Y-axis and X-axis readout gradient portions 40a and 41a (the latter here having a zero amplitude) occur, to encode the first sequence, first projection readout data. During this time interval, the data gate enable signal 42a is present, and the first projection NMR response echo signal 43a is acquired and processed. Shortly after the beginning of the next (second) view readout time interval $T_2$, the readout dephasing pulse portions 38b and 39b occur in the respective $G_Y$ and $G_X$ gradients, along with the next phase-encoding pulse 37b (of double amplitude and inverted polarity, in the time interval from time $t_{b2}$ to time $t_{c2}$. Thereafter, the Y-axis and X-axis readout gradient portions 40a and 41a occur, from time $t_{d2}$ to time $t_{e2}$, to encode the first sequence, second projection readout data. During this time interval, the data gate enable signal 42b is present, and the second projection NMR response echo signal 43b is acquired and processed. Shortly after the beginning of the next (third) view readout time interval $T_3$, the phase-encoding pulse 37c and the readout dephasing pulse portions 38c and 39c occur in the respective $G_Y$ and $G_X$ gradients in the time interval from time $t_{b3}$ to time $t_{c3}$. From time $t_{d3}$ to time $t_{e3}$, the Y-axis and X-axis readout gradient portions 40c and 41c occur, to encode the first sequence, third projection readout data. During this time interval, the data gate enable signal 42c is present, and the third projection NMR response echo signal 43c is acquired and processed. Shortly after the beginning of the last (fourth) view readout time interval $T_4$, the phase-encoding pulse 37d and the readout dephasing pulse portions 38qi d and 39d (the former readout-dephasing portion here being of zero amplitude) occur in the respective $G_Y$ and $G_X$ gradients in the time interval from time $t_{b4}$ to time $t_{c4}$. Thereafter, from time $t_{d4}$ to time $t_{e4}$, the Y-axis and X-axis readout gradient portions 40d and 41d (the former here having a zero amplitude) occur, to encode the first sequence, fourth projection readout data. During this time interval, the data gate enable signal 42d is present, and the fourth projection NMR response echo signal 43d is acquired and processed. At a time $t'_0$ occurring when the repetition interval $T_R$ has elapsed after the start time $t_0$ of the first sequence, the second sequence commences. Only the $G_f$ portion of the second sequence differs from the like portion of the first sequence; the flow-encoding pulses 24' a (negative polarity, amplitude A) occurs prior to the positive-polarity, A-amplitude pulse 25'a. The same "stripe"-encoding values of lobes 37 are present, and all of the same lobes 38 and 40, in the $G_Y$ gradient, and lobes 39 and 41, in the $G_X$ gradient, occur. In a typical angiographic study the patient's pulse rate, of 60-120 beats-per-minute, gives rise to a repetition time interval $T_R$ of between about 0.5 seconds and about 1.0 seconds. Even with cardiac synchronization to insure consistent velocity during each measurement, view sampling time intervals $T_n$ on the order of 5 milliseconds typically allow data for up to 10 different views to be obtained, even though the $T^*_2$ of the flowing blood, over this total interval, may cause some degradation of later view quality.

In a degenerate case of this mode, the view angle $\theta_n$ is not changed for each echo and the readout dephasing portions 46a–46d (for $G_y$) are all of equal amplitude, as are portions 47a–47d (for $G_x$), and each set of the readout gradients 48a–48d and 49a–49d are of one amplitude and like polarity. The projection dephasing lobe for the j-th echo can be substantially cancelled by the projection rephasing lobe for the (j−1)−th echo. However, according to equations 5a and 5b, the readout dephasing lobe of the j−th echo and the readout rephasing lobe for the (j−1)−th echo add constructively. These readout rephasing/dephasing lobes can be eliminated altogether if alternate readout gradients are negated, as shown in FIG. 2c. Thus, after RF pulse 20 (and slice-selective gradient pulses 21 and 22, if used) and that pair of flow-encoding pulses 24a/25a (for the first sequence of each pair) or 24'a/25'a (for the second sequence of each pair), the readout portions commence with a single $G_{READOUT}$ dephasing pulse lobe 50 and a single $G_{PROJECTION-DEPHASING}$ pulse lobe 51, both substantially simultaneous with the first phase-encoding lobe 37a. No other dephasing or rephasing lobes appear in either readout or projection gradients; the alternating-polarity readout gradient pulse portions 52a, 52b, 52c and 52d, respectively coincident with data-gate-enabled interval portions 42a, 42b, 42c and 42d, are sufficient. Such a general pulse sequence can be used to acquire a series of M identical data sets which can then be summed to enhance the signal-to-noise ratio. Note that while all M=4 data acquisitions, in FIG. 2c, are at the same projection angle, it is possible to take a first number $M_1$ of readouts at one angle $\theta_1$ and take another number $M_2$ (which need not be equal to $M_1$) of readouts at another angle $\theta_2$, and so on. Blending of these techniques can be used to acquire interleaved $M_i$ sequential or non-sequential readouts at a projection angle $\theta_i$, $M_j$ sequential or non-sequential readouts at angle $\theta_j$, $M_k$ sequential or non-sequential readouts at angle $\theta_k$, and so on, in each sequence of each sequence pair. Thus, if M is greater than one, improved signal-to-noise ratio can be made available for certain projection angles, even in a multi-angle set of projections.

SIMULTANEOUS ACQUISITION OF ORTHOGONAL FLOW DIRECTION IMAGES

As mentioned hereinabove, the recovered data set for each individual angiogram contains a set of flow components in only a single direction. Therefore, a pair of angiograms, taken in directions A and B orthogonal to one another, must be combined to yield a total flow angiogram with each pixel having a total intensity $I_t$ given by the formula $$I_t = (I_A^2 + I_B^2)^{\frac{1}{2}} \quad (6)$$

where $I_A$ and $I_B$ are the respective flow intensities in respective directions A and B. In the single-echo prior art angiography pulse sequence, each of the multiplicity (e.g. 128 or 256) of sequence pairs, for each of the pair of angiograms, could have been either sequentially acquired (acquire all of the required, e.g. 128 or 256, sequence pairs for the angiogram in the A direction and then acquire all of the required, e.g. 128 or 256, sequence pairs for the angiogram in the B direction) or could have been concurrently acquired with interleaved acquisitions (acquire a first sequence pair in the first A direction and then acquire a first sequence pair in the B direction; then acquire the sequence pairs in the sequential A and B directions for the second, third, . . . respective sequence pairs of the required number, e.g. 128 or 256, of such sequence pairs). For example, the first image might be acquired with flow sensitivity in the readout direction (e.g. along the X axis) while the second image might be acquired with flow sensitivity in the pulse-encoding direction (e.g. along the Z axis). Whichever pair or axes is selected, it will be seen that the total flow angiogram, whether constructed of two sequential single-direction-flow angiograms or two interleaved concurrent single-direction-flow angiograms, requires twice the acquisition time of a single flow angiogram. To overcome this disadvantage, a two-flow-component total angiograph can be provided with essentially simultaneous acquisition of the two flow components by utilizing the general interleaved multiple-echo technique illustrated in FIG. 3a. This sequence acquires both the A and B direction flow-sensitive echoes in the single sequence pair for each one of the required (e.g. 128 or 256) total "stripes" for the total image, rather than requiring two pairs of sequences for each stripe.

In accordance with another aspect of the invention, the data for each of a pair of angiograms, orthogonal to one another as required for displaying a total flow angiogram, is acquired in interleaved manner in each one of a pair of readout time intervals during each imaging sequence of each angiographic sequence pair. The flow-encoding gradient applied for the first echo is followed, after the readout of the first echo response data, by a pair of flow-encoding gradients having inverted polarity respective to the first flow-encoding gradient. One of the pair of second gradients has an inverted-polarity second flow-encoding gradient pulse pair, in the first gradient direction, to remove the velocity-induced phase shift created by the first flow-encoding gradient pulse pair. The other part of flow-encoding gradient pulses is applied in a second flow-encoding direction essentially orthogonal to the direction of the first pair. The subsequent second echo response data is received from a flow-sensitive direction orthogonal to the flow-sensitive direction of the first echo response data. It should be understood that is is convenient, but not necessary, to assign the orthogonal flow-sensitive directions to coincide with the respective readout and phase-encoding gradient directions, such that $I_A = I_\theta$ and $I_B = I_\phi$. That is, if the readout gradient is applied to the X-axis of the Cartesian coordinate set, and the phase-encoding gradient is applied to the Z axis thereof, the first flow gradient may be applied in the Z-axis direction and the second flow gradient applied in the X-axis direction. The two interleaved acquired echoes are independently processed to obtain the flow component angiogram intensity sets, which are then combined utilizing equation 6. It will be seen that phase shift between the first and second echo angiograms, due to resonance offsets and the like, are not important, as it is only the magnitude of each angiogram which are added. It will also be understood that, because the echoes are acquired relatively closely together in time (typically on the order of 10 milliseconds of one another, for the data in each sequence), the $T_2^*$ signal intensity differences of the echo pair will be relatively small. It will also be understood that the sequence can be extended to add a third echo, or even a fourth echo, which can be processed and compared to the processed echoes from the first and or second echoes to derive factors useful to correct for the $T_2^*$ intensity decay.

The general form of RF/gradient pulse sequence for obtaining simultaneous acquisition of orthogonal flow direction images is shown in FIG. 3a. The nutative 90° RF signal pulse 20, either with slice-selective gradient lobe 21 and rephasing lobe 22, or without slice-selective gradient (as desired), occurs in the expected time intervals between the times $t_0$ and time $t_2$. The first pair of flow-encoding gradient pulses 24a and 25a (of gradient $G_{FLOW1}$) occurs between time $t_3$ and time $t_6$; thereafter, the first readout time interval commences with a preceding dephasing pulse portion 55a, substantially simultaneous with a projection-dephasing gradient pulse lobe 56 and the first phase-encoding gradient pulse lobe 37'a. The associated echo, caused to occur in the middle of the first readout time interval, when associated readout gradient pulse portion 58a is present, is received during the data gate enabled portion 59a. Thereafter, the readout gradient is provided with a rephasing pulse 60 to remove the phase shift accumulated during the generation of the first echo; the readout time interval ends at the termination of pulse 60. An inverted-polarity phase-encoding gradient lobe 37'b appears substantially simultaneous with rephasing lobe 60, to correct for the phase shift provided in the phase-encoding direction due to pulse 37'a. A short time after the cessation of pulse lobes 60 and 37'b, the effect of the first flow-encoding gradient pair of pulses 24a–25a (or the inverted-polarity pulses 24'a/25'a in the second sequence of the pair) is phase compensated for by a second flow-encoding pulse pair, with reversed polarity, in the first flow gradient. This pair of pulses 24b and 25b (or inverted polarity pulses 24'b and 25'b in the second sequence of the sequence pair), respectively occur with the same time interval $T_g$ (respectively between times $t'_3$ and $t'_4$ or between times $t'_5$ and $t'_6$), and with an interpulse time interval T' substantially equal to the first pulse-pair interval T. At essentially the same time, a pair of flow-encoding pulses is provided in the second, orthogonal gradient $G_{FLOW2}$; the polarity of this pair of pulses is the same as the polarity of the first flow encoding pulses 24a and 25a (or 24'a and 25'a) in the first flow encoding gradient direction-i.e. a first positive polarity pulse 62 followed by a negative-polarity pulse 64 in the first sequence (or a negative-polarity pulse 62' followed by a positive polarity pulse 64', in the second sequence of the sequence pair). After the second flow direction has been encoded by pulses 62 and 64, the second echo readout is prepared for with the occurence of a preceding dephasing pulse lobe 55b. The orthogonal flow direction data, encoded in the readout direction by readout gradient portion 58b, is acquired during data gate enable portion 59b. After the entire sequence has been repeated with inverted flow-encoding pulses (e.g. pulses 24'a/25'a, 24'b/25'b and 62'/64'), the data from the first echo of the first sequence is subtracted from the data from the first echo of the second sequence to derive the first-direction image data. The data from the second echo of the first sequence is subtracted from the data for the second echo of the second sequence to provide the data set for the orthogonal-direction image. Thereafter, the two data sets are two-dimensionally Fourier transformed and added using the relationship $C_{ij} = ((A_{ij})^2 + (B_{ij})^2)^{\frac{1}{2}}$, where $C_{ij}$ is the final data for a point i, j in the two-dimensional image matrix, $A_{ij}$ is the data set obtained for that point i, j in the image generated responsive to the first echo response of each sequence, and $B_{ij}$ is the data set for the same point i, j in the image generated from the second echo response of each sequence.

Figure 3B:
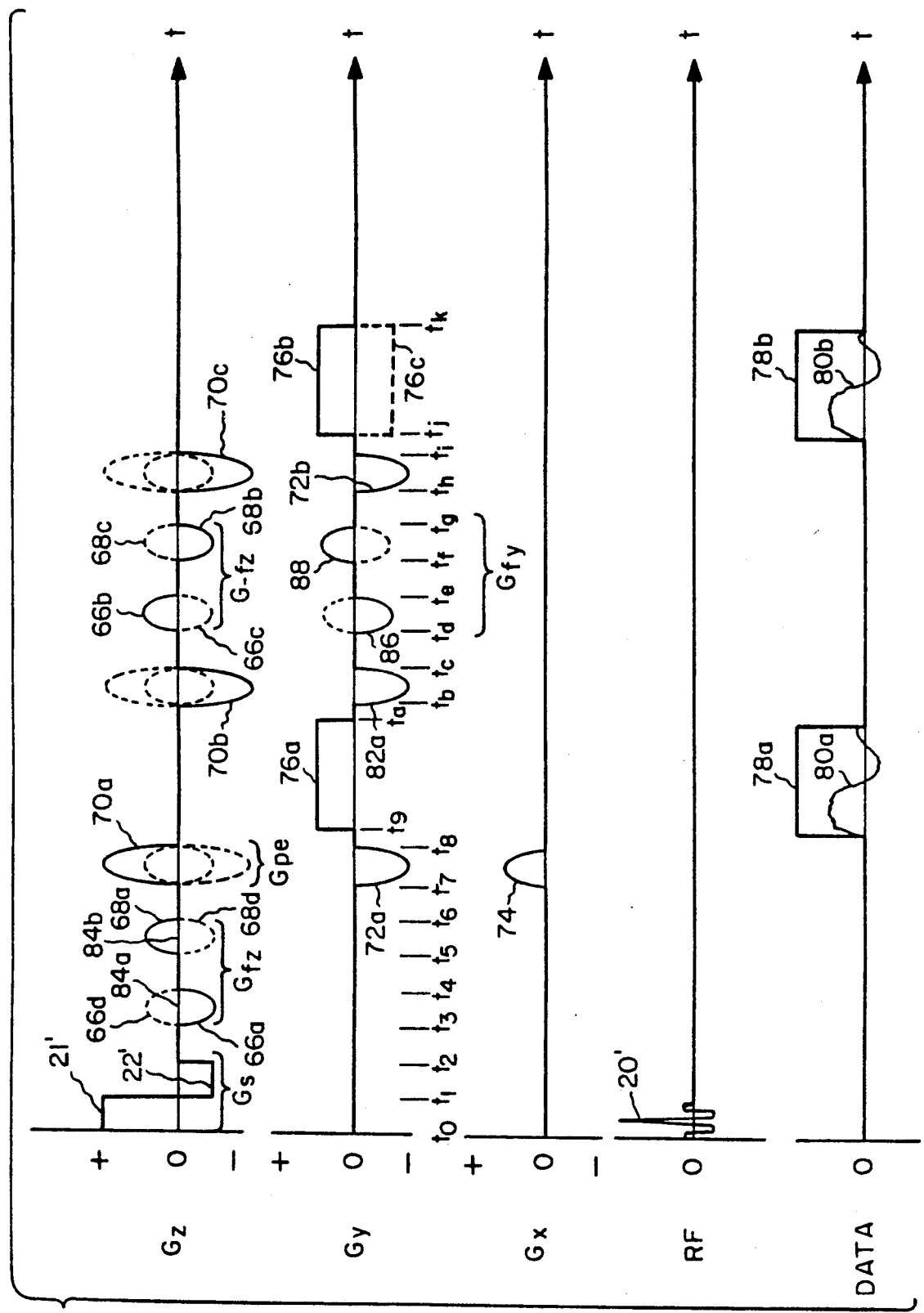
FIG. 3b is a set of time-coordinated graphs illustrating RF, data gate and magnetic field gradient signals for one presently preferred embodiment of a method for angiographic image acquisition, utilizing the principles of the general method of FIG. 3a, for a system utilizing gradient fields arranged along Cartesian coordinate system axes.

The specific case in a Cartesian coordinate system is illustrated in FIG. 3b, which both emphasizes that the flow-encoding pulse pair will operate properly if inverted in both sequences of the pair, and also illustrates the flow-encoding pulse pair of second sequence of a "normal" sequence pair (i.e. where the first sequence pair has a first positive-polarity pulse). After the RF signal pulse 20', with or without the slice selective $G_Z$ gradient pulse 21' and its associated rephasing pulse 22', the first-direction-selective (e.g., Z-direction) flow-encoding set of gradient pulses $G_{fz}$ includes a first negative-polarity pulse 66a, between times $t_3$ and $t_4$, and a second positive-polarity pulse 68a, between times $t_5$ and $t_6$. At a slightly later time $t_7$, the phase-encoding gradient $G_{pe}$ portion commences with the associated multi-valued one of the gradient pulses 70a for that one of the multiplicity of stripes in the sequence-pair data subset. Simultaneously therewith, in the time interval between time $t_7$ and time $t_8$, the readout dephasing pulse 72a is provided, along with the dynamic-range-limiting projection-dephasing pulse 74 in the $G_X$ signal. After the phase-encoding, projection-dephasing and readout-dephasing pulses, the Y-direction readout gradient portion 76a is present from time $t_9$ to time $t_a$, during which time interval the data gate 78a is enabled and a received response signal 80a is acquired, digitized and processed as required by a particular system. Thereafter, the rephasing pulse 82 in the readout gradient $G_Y$ commences at time $t_b$ and terminates at time $t_c$, as does the inverted-polarity phase-encoding-cancelling pulse 70b. Slightly thereafter, the pair of first direction (Z-direction) cancelling pulses 66b and 68b occurs, for a cancelling gradient $G_{-fz}$, in the time interval between time $t_d$ and $t_g$, while the second direction (Y-direction) flow-encoding pulses 86 and 88 (for second flow gradient $G_{fy}$) occur substantially simultaneously therewith. The phase change in the Z direction having been corrected for by pulses 66b/68b and flow-encoding having now been enabled in the Y direction, new phase-encoding pulse 70c occurs substantially simultaneous with the Y-axis readout preliminary dephasing pulse 72b, in the time interval from time $t_h$ to time $t_i$. Thereafter, in the time interval from time $t_j$ to time $t_k$, the readout gradient portion 76b is present, and the data gate 78b is open to receive the second, Y-directed received response signal 80b, in direction orthogonal to the Z-direction of the first response signal 80a. The Z and Y projection data sets are Fourier-transformed, subjected to the operations of equation 6 and stored, as a total angiogram data set, for display as required.

HIGH SUPPRESSION OF MOTION ARTIFACTS

In accordance with another feature of the present invention, if the first flow-encoding pair of pulses 66a/68a are provided with zero amplitude, as indicated by the zero-amplitude portions 84a and 84b, where the signal sequence illustrated in FIG. 3b is now the first sequence, (rather than the second sequence as previously described), of each sequence pair, then a degenerative case is present in which one single-flow-direction image with relatively high suppression of motion artifacts is obtained. That is, the illustrated high-supression sequence has (a) zero-amplitude portions 84a and 84b appearing before the first readout data gate 78a in both of the first and second sequences of each sequence pair, and (b) a positive-polarity first pulse 66b and a negative-polarity second pulse 68b between the first and second data gates in the fist sequence or a negative-polarity pulse 66c (broken-line) and a positive-polarity pulse 68c (broken-line) between the first and second data gates in the second sequence, of each sequence pair, to provide a gradient-refocussed spin-warp sequence where both echoes are taken with the same view angle. Since the first echo response data signal 80a is not subjected to flow-sensitive phase modulation, while the second echo signal 80b (being acquired after the pair of flow-encoding pulses 66c and 68c) is flow-sensitive and has been phase modulated, the subtraction of the first sequence second response signal 80b data set $S_{12}$ from the first sequence, first response signal 80a data set $S_{11}$ will itself provide a data set $S_1=(S_{11}-S_{12})$ having stationary spin cancellation for each sequence. The stationary spin cancellation of the difference of the second ($S_{22}$) and first ($S_{21}$) data sets of second sequence, of the sequence pair, will result in another data set $S_2=(S_{21}-S_{22})$ which can be subtracted from the first sequence data set $S_1$ to obtain a final data set $S=S_1-S_2$ having additional stationary spin suppression. The displayed image will have the particular data value for a pixel at a location i, j formed by taking the difference of the differences between acquired sets of echoes; that is, $E_{ij}=(A_{ij}-B_{ij})-(C_{ij}-D_{ij})$, where $E_{ij}$ is the resulting i, j point data in the two-dimensional data matrix and A, B, C and D are the respective data points for the first sequence-first echo, first sequence-second echo, second sequence-first echo and the second sequence-second echo, all of which are taken after Fourier transformation data processing is completed. It will be seen that the second and third dephasing gradient pulses 86 and 88 can be eliminated if the second readout gradient pulse 76b is provided as an inverted-polarity pulse 76c. It will also be understood that similar utility can be found for a sequence pair with the first sequence having first flow-encoding pulses 66d/68d and second flow-encoding pulses 66c/68c, and the second sequence having first flow-encoding pulses 68a/68a and second flow-encoding pulses 66b/66b.

MULTIPLE VELOCITY IMAGES

In yet another aspect of the present invention, as also illustrated in the Cartesian coordinate sequence of FIG. 3b, another degenerative case utilizes the additive nature of the phase changes in the response signals, induced by flow and flow-encoding gradient pulses, to provide a set of image data for each of a plurality of different velocity ranges without the necessity for separately acquiring each range in a separate set of sequence pairs. Generally, one of N identical pairs of flow-encoding gradient pulses occur before each of N different-range echoes; the total phase change is additive, such that the total phase change in the N-th echo, after the N-th pulse pair, is N times as greater as the phase change in the first echo, for the same flow velocity. Thus, the detected velocity is decreased by a factor N, for the N-th echo. That is, if the total phase shift for the first echo is $\phi_1$, corresponding to a flow velocity $V_1$, then the N-th echo phase shift $\phi_N$ for the $V_1$ velocity is $N\cdot\phi_1$ and the flow velocity for the basic phase amount $\phi_1$ is $V_1/N$. The positive-polarity first pulse 66d (chain-line) and the negative-polarity second pulse 68d (also chain-line) occur (for N=1) prior to the acquisition of the first echo (from time $t_9$ to time $t_a$) in the first sequence of a pair. Thereafter, a second echo (N=2) during time $t_j$ to time $t_k$ is acquired responsive to the same-polarity pair of later initially-positive-polarity pulse 66b and inverted-polarity second pulse 68b. Respective third, ..., N-th pairs of initially-positive-polarity and subsequent negative-polarity pulses can be used for acquiring third, ..., N-th echoes. In the second sequence of each sequence pair (each pair having a different value of phase-encoding pulse 70), the first pair of pulses consists of negative-polarity pulse 66a and positive-polarity pulse 68a, while the second pair consists of negative pulse 66c and positive pulse 68c, etc. Thus, N images are acquired, with each later image being sensitive to a different, slower flow velocity. If the image data sets are Fourier transformed in the "third dimension" (i.e., as a function of response echo signal number N), then a true velocity selective angiogram will result.

While the present invention has been described with respect to several presently preferred embodiments thereof, many variations and modifications will now occur to those skilled in these arts. For example, while a gradient signal is provided for dephasing the spin magnetization in the projection direction to reduce the large amplitude of the signals generated by stationary spins (and thus reduce residual stationary spin components in the final angiogram), the projection-dephasing gradient can be removed if phase cancellation of the desired response signals appears to be occurring because of the physical location of the involved vessels; the artifact so occurring is reasonably easy to recognize. Similarly, it is contemplated that one could modify the sequences with: acquisitions at identical times after excitation pulses, to preserve phase information; maintenance of identical time intervals between phase-encoding pulse and readout gradient centers, to minimize geometric distortion; inversion of gradient polarity on alternate echoes to reduce accumulation of velocity-induced phase-shift; and the like. It is my intent, therefore, to be limited solely by the scope of the appended claims and not by the specific details presented herein by way of illustration.

What is claimed is:

1. A method for acquiring at least one nuclear magnetic resonance (NMR) angiographic image of flowing material in at least a selected portion of a sample comprising the steps of:
   (a) immersing the sample in a main static magnetic field;
   (b) nutating, in the initial part of each of a first sequence and a second of a sequential pair of imaging sequences for each of a multiplicity S of regions of said selected sample portion, the spins of all nuclei of a selected species;
   (c) applying a pair of alternating-polarity flow-encoding signal pulses in a first magnetic field gradient impressed upon the sample, in a first direction selected to establish one axis of the NMR angiographic projection image, to cause a resulting NMR response echo signal from the spin of a moving nucleus to differ from the NMR response echo signal resulting from the spin of a substantially stationary nucleus; each of the flow-encoding pulses in the first sequence of each pair having a polarity opposite to the polarity of the like-positioned flow-encoding pulse in the second sequence of each pair;
- (d) acquiring, responsive to a readout magnetic field gradient impressed upon the sample in a second direction, substantially orthogonal to the first direction, a set of data from the NMR response echo signal evoked, from at least the sample portion, in each different one of a plurality M of response data acquisition time intervals of each of the first and second sequences, and including the substeps of: obtaining all M of the response data sets in each sequence for a single common readout second direction; and summing the data values for all M response data sets in each sequence to obtain a single summed data set for that common second direction and that sequence;
- (e) subtracting the summed data set from one of the first and second sequences from the summed data set from the other sequence of the sequence pair, to generate the difference data set for that pair; and
- (f) generating, responsive to all difference data sets, each of at least one angiographic projection image, each lying in a plane having a preselected relationship with respect to the first and second directions.

2. The method of claim 1, wherein step (b) includes the step of limiting the nutating action to a predetermined volume of the sample portion.

3. The method of claim 1, wherein the sample is a portion of a living entity having a cardiac cycle, and further including the step of gating the commencement of each sequence with respect to a designated point in the cardiac cycle of the entity.

* * * * *